(12) United States Patent
Katoda

(10) Patent No.: US 7,557,385 B2
(45) Date of Patent: Jul. 7, 2009

(54) ELECTRONIC DEVICES FORMED ON SUBSTRATES AND THEIR FABRICATION METHODS

(75) Inventor: Takashi Katoda, 4804-83, Ikku, Kochi-shi, Kochi (JP) 780-8130

(73) Assignee: Takashi Katoda, Kochi-shi (JP)

( * ) Notice: Subject to any disclaimer, the term of this patent is extended or adjusted under 35 U.S.C. 154(b) by 34 days.

(21) Appl. No.: 11/330,153

(22) Filed: Jan. 12, 2006

(65) Prior Publication Data

US 2006/0157695 A1  Jul. 20, 2006

(30) Foreign Application Priority Data

Jan. 19, 2005 (JP) .................. 2005-011248

(51) Int. Cl.
*H01L 29/74* (2006.01)
(52) U.S. Cl. .............. 257/103; 257/12; 257/183; 257/E29.094; 257/E29.098; 257/E29.143; 257/E29.148
(58) Field of Classification Search ............ 257/12, 257/103, 183, E29.094, E29.098, E29.143, 257/E29.148
See application file for complete search history.

(56) References Cited

U.S. PATENT DOCUMENTS

| 3,503,798 | A |   | 3/1970  | Yoshioka et al. |
| 3,728,594 | A |   | 4/1973  | Yim et al. |
| 4,373,145 | A |   | 2/1983  | McCarthy et al. |
| 4,965,594 | A |   | 10/1990 | Komuro |
| 5,038,609 | A |   | 8/1991  | Kumada |
| 5,293,510 | A | * | 3/1994  | Takenaka ............ 257/295 |
| 5,571,612 | A |   | 11/1996 | Motohiro et al. |
| 5,838,029 | A |   | 11/1998 | Shakuda |
| 5,990,500 | A |   | 11/1999 | Okazaki |
| 6,498,358 | B1| * | 12/2002 | Lach et al. ............ 257/183 |
| 6,513,362 | B1|   | 2/2003  | Yadav et al. |
| 6,627,959 | B1|   | 9/2003  | Tuller et al. |
| 7,250,630 | B2|   | 7/2007  | Katoda |

(Continued)

FOREIGN PATENT DOCUMENTS

EP   1 482 564   12/2004

(Continued)

OTHER PUBLICATIONS

Pending claims of U.S. Appl. No. 10/848,145, filed Jan. 29, 2007.

(Continued)

*Primary Examiner*—Fernando L Toledo
(74) *Attorney, Agent, or Firm*—Eric J. Robinson; Robinson Intellectual Property Law Office, P.C.

(57) ABSTRACT

The present invention relates to semiconductor electronic devices including molybdenum oxide formed on substrates which consist of materials which are used in known semiconductor electronic devices.

The present invention relates to also a new method to fabricate said electronic devices on substrates made of materials which have been used in usual electronic and photonic devices.

Suitable substrates consist of materials such as element semiconductors such as silicon and germanium, III-V compound semiconductors such as gallium arsenide and gallium phosphide, II-IV compound semiconductors such as zinc oxide, IV compound semiconductors, organic semiconductors, metal crystals and their derivatives or glasses.

16 Claims, 3 Drawing Sheets

U.S. PATENT DOCUMENTS

| | | | |
|---|---|---|---|
| 2004/0240501 A1 | 12/2004 | Katoda | |
| 2004/0251457 A1* | 12/2004 | Katoda | 257/12 |
| 2005/0062409 A1* | 3/2005 | Yamazaki et al. | 313/504 |
| 2005/0156197 A1 | 7/2005 | Tsutsui et al. | |
| 2005/0263756 A1* | 12/2005 | Yatsunami et al. | 257/40 |
| 2006/0038242 A1* | 2/2006 | Hsu et al. | 257/407 |
| 2006/0091797 A1* | 5/2006 | Tsutsui et al. | 313/506 |
| 2006/0157696 A1 | 7/2006 | Katoda | |

FOREIGN PATENT DOCUMENTS

| | | |
|---|---|---|
| EP | 1 487 022 | 12/2004 |
| FR | 972 330 | 1/1951 |
| JP | 52-046098 | 11/1977 |
| JP | 2002-217425 | 8/2002 |
| JP | 2004-356481 | 12/2004 |

OTHER PUBLICATIONS

Pending claims of U.S. Appl. No. 10/863,288, filed Feb. 16, 2007.
Pending claims of U.S. Appl. No. 11/330,154, filed Jan. 2, 2008.
Office Action (Appl. No. 2005-010248) Dated Oct. 14, 2008.
Specification, Drawings, Claims and Abstract filed Jan. 12, 2006 for U.S. Appl. No. 11/330,154.
Preliminary Amendment Document filed Jan. 12, 2006 for U.S. Appl. No. 11/330,154.
Transmittal of Priority Document filed Jan. 26, 2006 for U.S. Appl. No. 11/330,154.
Non-Final Official Action mailed Oct. 2, 2007 for U.S. Appl. No. 11/330,154.
Amendment filed Jan. 2, 2008 for U.S. Appl. No. 11/330,154.
Information Disclosure Statement filed Jan. 2, 2008 U.S. Appl. No. 11/330,154.
Amendment filed Jan. 9, 2008 for U.S. Appl. No. 11/330,154.
Final Official Action mailed Mar. 21, 2008 for U.S. Appl. No. 11/330,154.
Response filed Jun. 23, 2008 for U.S. Appl. No. 11/330,154.
Advisory Action mailed Jul. 29, 2008 for U.S. Appl. No. 11/330,154.
Amendment filed Aug. 21, 2008 for U.S. Appl. No. 11/330,154.
Supplemental Amendment filed Sep. 11, 2008 for U.S. Appl. No. 11/330,154.
Information Disclosure Statement filed Sep. 16, 2008 for U.S. Appl. No. 11/330,154.
Non-Final Official Action mailed Sep. 17, 2008 for U.S. Appl. No. 11/330,154.
Amendment filed Dec. 17, 2008 for U.S. Appl. No. 11/330,154.
Information Disclosure Statement filed Dec. 17, 2008 for U.S. Appl. No. 11/330,154.
Specification, Drawings, Claims and Abstract filed May 19, 2004 for U.S. Appl. No. 10/848,145.
Preliminary Amendment Document filed May 19, 2004 for U.S. Appl. No. 10/848,145.
Information Disclosure Statement filed Aug. 10, 2004 for U.S. Appl. No. 10/848,145.
Non-Final Official Action mailed Mar. 24, 2006 for U.S. Appl. No. 10/848,145.
Amendment filed Jun. 26, 2006 for U.S. Appl. No. 10/848,145.
Final Official Action mailed Sep. 29, 2006 for U.S. Appl. No. 10/848,145.
Amendment filed Jan. 29, 2007 for U.S. Appl. No. 10/848,145.
Interview Summary filed Mar. 28, 2007 for U.S. Appl. No. 10/848,145.
Interview Summary mailed Apr. 2, 2007 for U.S. Appl. No. 10/848,145.
Restriction/Election Requirement mailed Apr. 12, 2007 for U.S. Appl. No. 10/848,145.
Response to Election Requirement filed May 9, 2007 for U.S. Appl. No. 10/848,145.
Non-Final Official Action mailed Aug. 9, 2007 for U.S. Appl. No. 10/848,145.
Response filed Nov. 9, 2007 for U.S. Appl. No. 10/848,145.
Terminal Disclaimer filed Nov. 9, 2007 for U.S. Appl. No. 10/848,145.
Non-Final Official Action mailed Mar. 5, 2008 for U.S. Appl. No. 10/848,145.
Amendment filed Jun. 5, 2008 for U.S. Appl. No. 10/848,145.
Final Official Action mailed Jul. 24, 2008 for U.S. Appl. No. 10/848,145.
Amendment filed Oct. 24, 2008 for U.S. Appl. No. 10/848,145.
Notice of Non-Compliant Amendment mailed Nov. 20, 2008 for U.S. Appl. No. 10/848,145.
Response to Notice of Non-Compliant Amendment filed Dec. 20, 2008 for U.S. Appl. No. 10/848,145.
Information Disclosure Statement filed Jan. 26, 2009 for U.S. Appl. No. 10/848,145.
Response filed Jan. 26, 2009 for U.S. Appl. No. 10/848,145.
Advisory Action mailed Jan. 30, 2009 for U.S. Appl. No. 10/848,145.
Specification, Drawings, Claims and Abstract filed Jun. 9, 2004 for U.S. Appl. No. 10/863,288.
Non-Final Official Action mailed May 2, 2006 for U.S. Appl. No. 10/863,288.
Amendment filed Aug. 2, 2006 for U.S. Appl. No. 10/863,288.
Final Official Action mailed Oct. 16, 2006 for U.S. Appl. No. 10/863,288.
Amendment filed Feb. 16, 2007 for U.S. Appl. No. 10/863,288.
Notice of Allowability mailed Mar. 20, 2007 for U.S. Appl. No. 10/863,288.
Issue Notification mailed Mar. 20, 2007 for U.S. Appl. No. 10/863,288.
European Search Report (Application No. 06000615.2) dated Aug. 18, 2008.
Chen et al., "Structural, Electrical, and Optical Properties of Transparent Conductive Oxide ZnO:Al Films Prepared by DC Magnetron Reactive Sputtering," Journal of Vacuum Science and Technology, Part A, vol. 19, No. 3, May 2001, pp. 963-970.
Ferreira et al., "Lithium Insertion and Electrochromism in Polycrystalline Molybdenum Oxide Films," Solid State Ionics, vol. 136-137, Nov. 2, 2000, pp. 357-363.
Guha et al., "Ultraviolet and Violet GaN Light Emitting Diodes on Silicon," Applied Physics Letters, vol. 72, No. 4, Jan. 26, 1998, pp. 415-417.
Dalmasso et al., "Green Electroluminescent (Ga, In, Al)N LEDs Grown on Si(111)," Electronic Letters, vol. 36, No. 20, Sep. 28, 2000, pp. 1728-1730.
Pettus C., "A Molybdenum-Oxide Negative-Resistance Device", Jan. 1965, Proc. IEEE, vol. 53, No. 1, p. 98.
Office Action (Appl. No. 2003-154107) Dated Oct. 27, 2008.
Ivanova, T., et al., "Investigation of CVD Molybdenum Oxide Films," Materials Letters, vol. 53, Apr. 2002, pp. 250-257.
European Search Report (Application Serial No. 04011665.9) dated Jul. 8, 2004.
European Search Report (Application Serial No. 06000614.5) dated Feb. 17, 2009.
Cross et al., "*Low Pressure and Inductive Plasma Enhanced Chemical Vapor Deposition of $\alpha$-$MoO_3$ from $Mo(CO)_6$ and $O_2$ Using Experimental Design,*" Journal of Chemical Vapor Deposition, vol. 2, No. 1, Jul. 1993, pp. 59-78.
Guidi et al., "*Novel Gas Sensor Device Based on Thin $MoO_3$ Film and Low Power-Consumption Micromachined Si-Based Structure,*" IEEE International Conference on Solid-State Sensors and Actuators, Transducers 97, vol. 2, Jun. 16, 1997, pp. 943-946.

\* cited by examiner

ELECTRONIC DEVICES FORMED ON SUBSTRATES AND THEIR FABRICATION METHODS

BACKGROUND OF THE INVENTION

1. Field of the Invention

The present invention relates to semiconductor electronic devices including molybdenum oxide formed on substrates which consist of materials which are used in known semiconductor electronic devices.

More particularly, the present invention relates to field effect transistors, bipolar transistors, thyristors with a high breakdown voltage and hostile-environment electronic devices made up of new semiconductor which can solve difficult problems accompanying to such devices made up of known semiconductors with a large bandgap such as gallium nitride (GaN) and silicon carbide (SiC).

The present invention relates to also a new method to fabricate said electronic devices on substrates made of materials which have been used in usual electronic and photonic devices.

2. Related Background Art

Recently so-called power devices such as bipolar transistors, field effect transistors, and thyristors are used in various fields such as domestic electronic articles, cars, machine tools, and illumination. With increase of application, conversion and control of electric power with high efficiency and with a high speed are requested to power devices. Although power devices have been fabricated using silicon (Si) for a long time, limits of silicon devices are predicted. The limits come from the fact that the bandgap of silicon, about 1 electron volt (eV), is small. Research to realize power devices made up of semiconductors with large bandgaps, that is, so-called widegap semiconductors to overcome the limits has been widely done. In particular, development of power devices using gallium nitride (GaN) whose bandgap is about 3.43 eV or silicon carbide (SiC) whose bandgap is about 3.2 eV has been done extensively.

On the other hand, error or trouble of electronic devices due to noise which comes from the cosmic rays or cars and heat has been serious problems. It has been made clear that so-called hostile-environment devices which are proof against a severe environment with noise or heat should be made of semiconductors with large bandgaps. Development of electronic devices using GaN or SiC has been done from these points. However there are many additional problems to be solved to realize electronic devices made of GaN or SiC.

One of the most serious problem is that bulk crystal of GaN has not been obtained because an equilibrium vapor pressure of nitrogen is very high relative to that of gallium. Therefore, substrates made up of sapphire or silicon carbide (SiC) are used. GaN can not be formed directly on a sapphire substrate because there is lattice mismatch of 16% between sapphire and GaN. Therefore a buffer layer of aluminum nitride (AlN) is formed on a sapphire substrate before growth of GaN. AlN is resistive because it is difficult to dope impurities into AlN. Use of sapphire substrate in a device which includes multilayers of semiconductor such as a bipolar transistor and a thyristor is very disadvantageous to their structures and fabrication process. On the other hand, SiC substrate is very expensive because bulk crystal of SiC can be grown at a very high temperature of 2200~2400° C. GaN devices using SiC substrate or SiC devices are very expensive.

The problem to be solved realize a new device is to obtain a new substrate which replaces expensive substrate such as sapphire or SiC.

The second serious problem is to realize new devices which can be grown at a lower temperature than that at which GaN or SiC layers are formed. It is necessary to form layers of GaN or SiC at a temperature higher 1000° C. Large energy is necessary to form semiconductor layers at a high temperature. In addition, there are possibilities that atoms move between layers and a composition is disturbed or dopants move near the interface between layers.

The problems described above can be partly solved by using molybdenum oxide for such photonic devices. The inventor of the present invention discovered that high quality molybdenum oxide crystal has a bandgap larger than 3.2 eV and is very useful to be used in photonic and electronic devices (U.S. patent application Ser. No. 10/848,145 and Ser. No. 10/863,288).

In the patent applications described above, the facts and methods discovered by the inventor of the present invention are described. They are summarized as follows.

(i) High quality molybdenum oxide crystal has a bandgap of 3.45~3.85 eV. The results were obtained by experiment for molybdenum oxide layer with a thickness larger than 10 µm grown by oxidation of a molybdenum plate with a purity of 99.99% in oxygen with a purity of 99.9995%. For example, molybdenum oxide formed by oxidation at 550° C. for 120 min had a bandgap of 3.66 eV. The reason why molybdenum oxide formed by the method invented by the inventor of the present invention had a bandgap larger than that previously reported is that it was high quality molybdenum oxide crystal having a thickness larger than that previously reported. A bandgap is affected by structure of a layer, that is, crystal or non-crystal, strain in the layer and purity.

(ii) It was confirmed that molybdenum oxide formed by the present inventor's method is semiconductor also based on measurement of electronic properties.

However, in the patent applications described above, the molybdenum oxide crystal was formed by oxidation of a part of a metallic molybdenum plate. A part of a metallic molybdenum plate which was left without oxidation. Because the molybdenum plate was not crystal, some fabrication technologies such as cleavage could not used. Furthermore, precise control of a thickness of the molybdenum oxide layer was difficult when it was formed by oxidation of a molybdenum plate.

Therefore it is required to form a layer of semiconductor crystal having a bandgap larger than 3.2 eV on a new substrate which preferably consists of material which is used in known devices and preferably is crystal.

In the present patent, molybdenum oxide film can be formed on a substrate consisting of material which has been used in usual electronic and photonic devices. The most popular material is silicon. One of the most serious problem on a substrate can be solved by the present invention.

In the present invention, molybdenum oxide film can be formed on a substrate by a new method at a temperature lower than 850° C. Therefore, the second serious problem can be solved by the present invention.

SUMMARY OF THE INVENTION

The present invention is directed to semiconductor electronic devices comprising metal oxide grown on substrates and their fabrication method.

Particularly, the present invention uses as the metal oxide molybdenum oxide which has a bandgap larger than 3.2 eV and is very useful to fabricate electronic devices such as a diode, a bipolar transistor, a field effect transistor and a thyristor with a high withstand voltage. The present invention is also directed to hostile-environment electronic devices composed of high-purity molybdenum oxide.

An important aspect of the present invention is that a molybdenum oxide film can be formed on a substrate consisting of material which has been traditionally used in usual photonic and electronic devices. The most popular material, which may be used as such substrate material, is silicon.

Another important aspect of the present invention resides in a novel method to fabricate electronic devices on substrates. According to this novel method, at least a first layer of metal oxide is formed on a substrate, preferably, molybdenum oxide formed on directly on the substrate. The present invention's novel method includes following series of steps. A substrate and source material are set in a growth chamber at a first step. As the source material, a molybdenum plate is typically used and a typical substrate is silicon. A temperature profile is formed in the growth chamber such that a temperature at the source material is higher than that at the substrate at a second step. After the temperature profile is formed, oxygen gas is flowed for a predetermined period which depends on a thickness of the molybdenum oxide which is required to form a specific device at a third step.

A molybdenum oxide layer (or layers) in electronic devices can be formed by using any method which includes steps similar to the steps described above. In those cases, the substrate may act as a part of a device.

Suitable substrates consist of materials selected from IV element semiconductors such as silicon and germanium, III-V compound semiconductors such as gallium arsenide and gallium phosphide, II-IV compound semiconductors such as zinc oxide, IV compound semiconductors, organic semiconductors, metal crystals and their derivatives or glasses.

DETAILED DESCRIPTION OF THE PREFERRED EMBODIMENTS

Reference will now be made in greater detail to preferred embodiments of the invention.

The problems described above were resolved by using high-purity molybdenum oxides as at least a part of electronic devices such as a diode, a field effect transistor, a bipolar transistor and a thyristor formed on substrates which consist of materials which have been used in usual electronic and photonic devices.

The present invention directed to electronic devices at least in a part made up of high-purity molybdenum oxide having a bandgap larger than 3.45 eV. The devices include a resistance device, a diode, a transistor, a Hall effect device, a thermistor, a varistor, a thyristor and memory devices.

Figure 1:
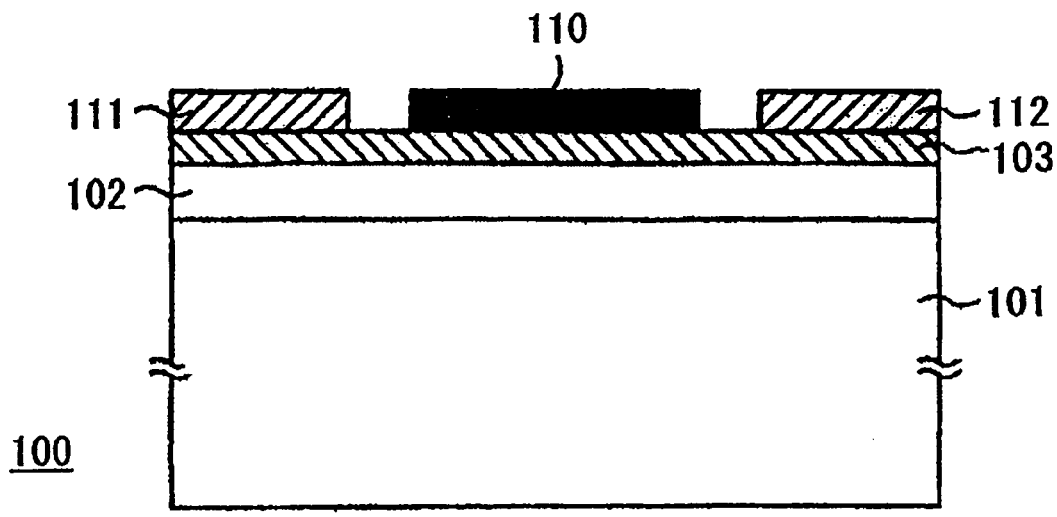
FIG. 1 is a schematic view of a structure of the field effect transistor according to the first embodiment of the present invention.

FIG. 1 is a schematic view of a field effect transistor (100) according to the first embodiment of the present invention. In the figure, a substrate (101) is made up of silicon. However, other materials can be used. A layer (102) of molybdenum oxide was formed on the substrate (101). The layer (102) was formed by the following steps. A molybdenum (Mo) plate was used as source and a silicon (Si) substrate were used in this example. At first, the source and the silicon substrate (101) were rinsed and dried. Then they were set in a growth chamber. At the next step, the growth chamber was heated so that a temperature at the source zone was 630° C. and that at the substrate zone was 530° C. under nitrogen atmosphere. After the source and the substrate (101) were heated to the temperatures, respectively, high-purity oxygen was flowed in the growth chamber and kept for 6 hours. A thickness of the layer (102) was 6 μm. Although the layer (102) was not intentionally doped, it was n type with a carrier concentration of $1.0 \times 10^{16}$ cm$^{-3}$. It is considered that oxygen vacancies act as donors. A layer (102) acts as a buffer layer which confines disorder in the layer (102) which originates because the layer (102) has a different composition from the substrate (101). It is not necessary to form the layer (102) when it is not necessary to make the characteristics of the device as good as possible.

On the layer (102), a layer (103) of n type molybdenum oxide with higher quality was formed. The layer (103) of molybdenum oxide was formed by the similar method used to form the layer (102) with a growth condition in which a source temperature was 670° C. and that of a substrate was 600° C. It was n type with a carrier concentration of $6.0 \times 10^{16}$ cm$^{-3}$. A thickness of the layer (103) was 0.2 μm. The layer (103) was a channel layer of the field effect transistor (100).

A Shottky electrode (110) which constitutes of double layers of platinum and gold was formed on the layer (103) as a gate of the field effect transistor (100). On the layer (103), a source (111) and a drain (112) electrodes were formed also. The electrodes constitute of gold/titanium/gold triple layers.

Figure 2:
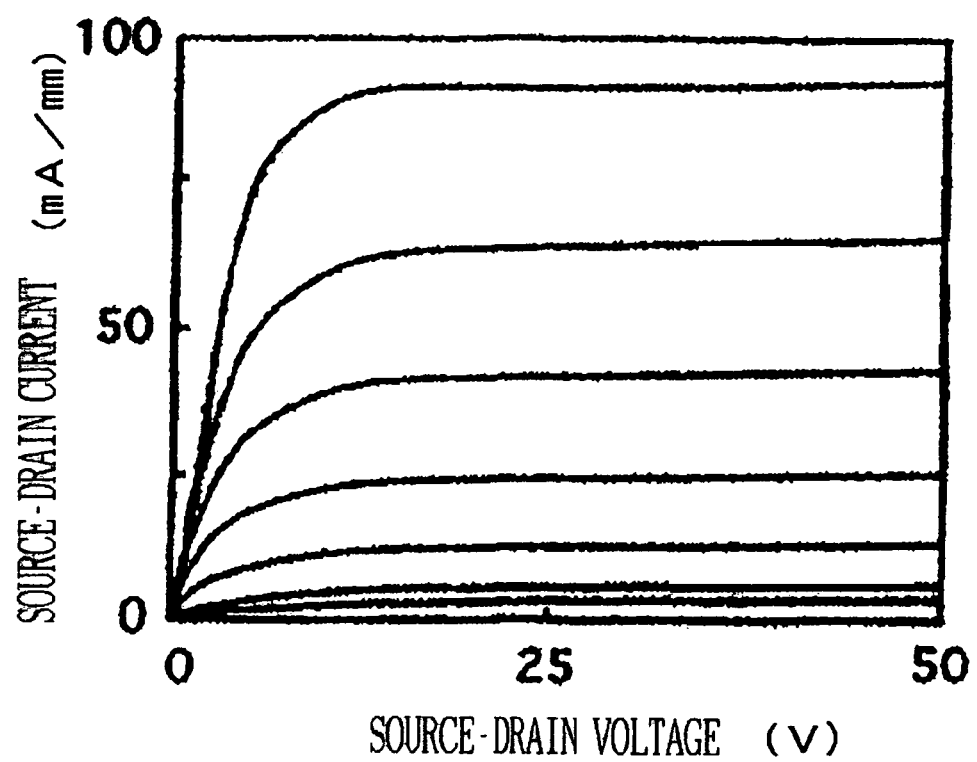
FIG. 2 shows the current-voltage characteristics at 500° C. obtained by simulation for the field effect transistor whose structure is shown in FIG. 1.

It was shown by simulation assuming that a gate length was 2.5 μm and a gate width was 100 μm that the field effect transistor has excellent characteristics with the maximum mutual conductance of 30 mS/mm. FIG. 2 shows the current-voltage characteristics at 500° C. obtained by simulation. It was shown also that it has a stable withstand voltage larger than 100 V. It was assumed in the simulation that the bandgap of molybdenum oxide was 3.75 eV. The results shown above mean that a field effect transistor with a high withstand voltage and an excellent hostile-environment field effect transistor can be realized without use of an expensive substrate and fabrication process at a high temperature by using high-purity molybdenum oxide.

Figure 3:
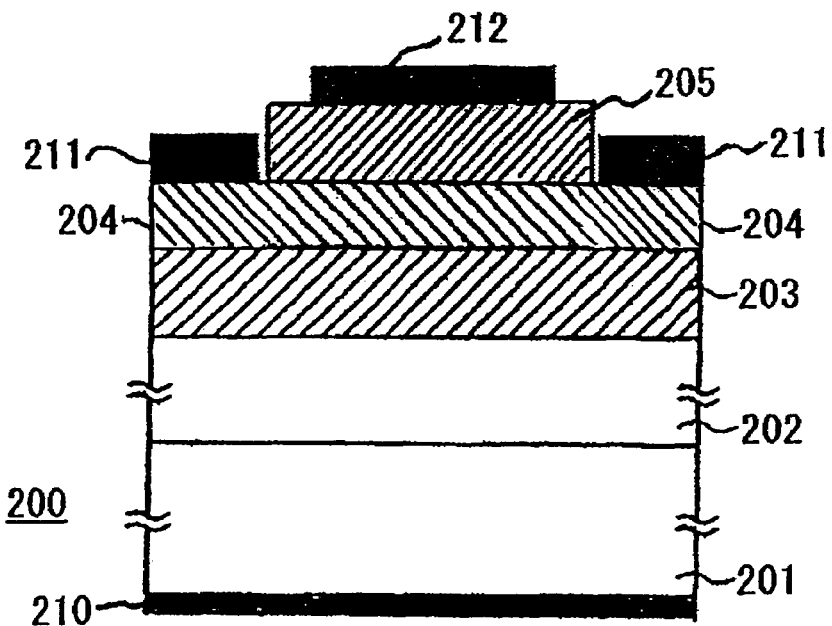
FIG. 3 is a schematic view of a bipolar transistor according to the second embodiment of the present invention.

FIG. 3 is a schematic view of a bipolar transistor (200) according to the second embodiment of the present invention. In this embodiment, a substrate (201) consists of silicon. However other materials can be used as a substrate. On the substrate (201) a layer (202) of molybdenum oxide was formed. The layer (202) was formed by the following steps. A molybdenum (Mo) plate was used as source and silicon (Si) substrate were used in this example. At first, the source and the silicon substrate (201) were rinsed and dried. Then they were set in a growth chamber. At the next step, the growth chamber was heated so that a temperature at the source zone was 630° C. and that at the substrate zone was 530° C. under nitrogen atmosphere. After the source and the substrate (201) were heated to the temperatures, respectively, high-purity oxygen was flowed in the growth chamber and kept for 6 hours. A thickness of the layer (202) was 6 µm. Although the layer (202) was not intentionally doped, it was n type with a carrier concentration of $1.0\times10^{16}$ cm$^{-3}$. It is considered that oxygen vacancies act as donors. The layer (202) acts as a buffer layer which confine disorder in the layer (202) which originates because the layer (202) has a different composition from the substrate (201). It is not necessary to form the layer (202) when it is not required to make characteristics of the devices as good as possible.

A layer (203) of n type molybdenum oxide with better quality was formed on the layer (202). The layer (203) had a carrier concentration of $6.0\times10^{16}$ cm$^{-3}$ and a thickness of 450 nm. It functions as a collector of the bipolar transistor (200). The layer (203) was formed by the similar method used to form the layer (202) with a growth condition in which a source temperature was 670° C. and that of a substrate was 600° C. Its carrier concentration was $6.0\times10^{16}$ cm$^{-3}$ and thickness was 450 nm. The layer (203) acts as a collector of the bipolar transistor (200).

A layer (204) of p type molybdenum oxide which was doped with zinc to a carrier concentration of $2.0\times10^{17}$ cm$^{-3}$ was formed on the layer (203). The layer (204) was formed by the similar method used to form the layer (202) with a growth condition in which a source temperature was 650° C. and that of a substrate was 550° C. Powder of zinc oxide was set as a dopant source between the source and the substrate where a temperature was 640° C. A thickness of the layer (204) was 350 nm. The layer (204) has a function of the base of the bipolar transistor (200). A layer (205) of n type molybdenum oxide with a carrier concentration of $3.0\times10^{17}$ cm$^{-3}$ and a thickness of 400 nm was formed on the layer (204). The layer (205) has a function as the emitter of the bipolar transistor (200). As shown in FIG. 3, the n type molybdenum oxide layer (205) was formed on the base layer (204) except the peripheral region such that a base electrode (211) was formed on the base layer (204). An emitter electrode (212) was formed on the emitter layer (205). The base electrode (210) and the emitter electrode (212) were constituted of nickel/titanium/gold triple layers and aluminum/titanium/double layers, respectively. A collector electrode (210) was constituted of gold and formed on the back surface of the silicon substrate (201) because the silicon substrate (201) and the layer (202) were conductive.

Figure 4:
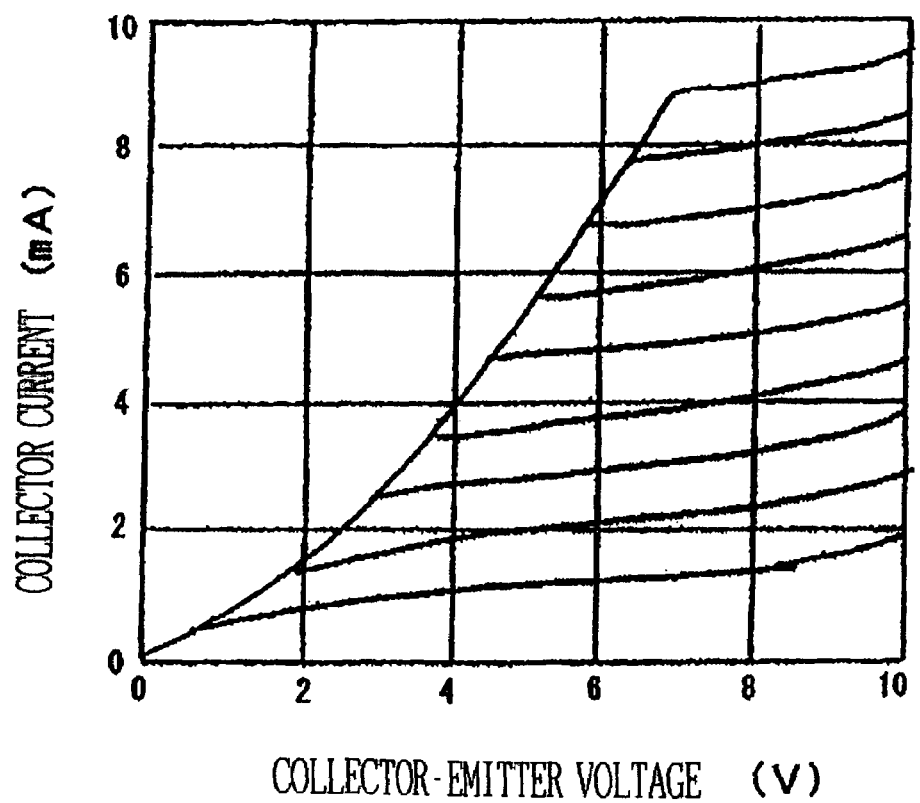
FIG. 4 shows the current-voltage characteristics at 500° C. obtained by simulation for the bipolar transistor whose structure is shown in FIG. 3.

FIG. 4 shows current-voltage characteristics at 500° C. obtained by simulation for the bipolar transistor whose structure is shown in FIG. 3. The characteristics shown in FIG. 4 mean that a bipolar transistor formed of molybdenum oxide functions at a high temperature such as 500° C. It has been reported that a bipolar transistor comprising of GaN functions at 300° C. However a bipolar transistor comprising of molybdenum oxide functions at a higher temperature. Moreover, it does not need an expensive substrate and fabrication process at a temperature higher than 1000° C.

Figure 5:
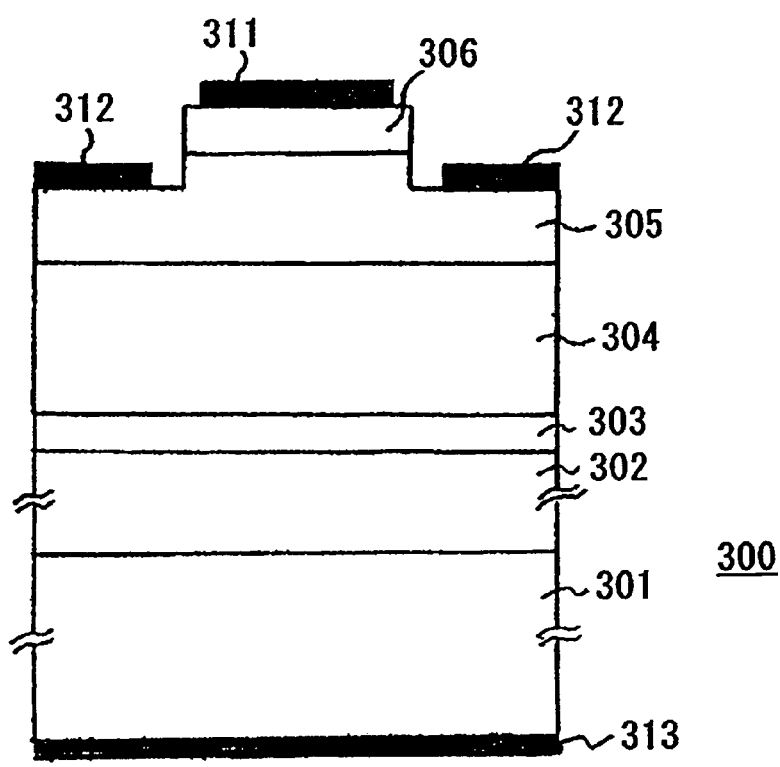
FIG. 5 is a schematic view of a thyristor according to the third embodiment of the present invention.

FIG. 5 is a schematic view of a structure of a thyristor (300) according to the third embodiment of the present invention. Only essential elements to the function are shown in FIG. 5. The thyristor (300) includes a substrate of silicon. However other materials can be used as a substrate. On the substrate (301), a buffer layer (302), a p type molybdenum oxide layer (303), a n type molybdenum oxide layer (304), a p type molybdenum oxide layer (305) and a n type molybdenum oxide layer (306) were formed. These layers were formed by the vapor growth used to form layers included in devices according to the first and the second embodiments.

The buffer layer (302) was formed with a condition that a source temperature was 680° C. and that of a substrate (301) and a dopant source, zinc oxide, was 600° C. A thickness of the layer (302) was 6.0 µm. The layer (303) was formed with a condition that a source temperature was 670° C., that of zinc oxide was 650° C. and that of a substrate was 600° C. It was p type with a carrier concentration of $7.0\times10^{17}$ cm$^{-3}$. A thickness of the layer (303) was 50 nm. A n type layer (304) was formed on the layer (303). The layer (304) was formed with a condition that a source temperature was 640° C. and that of substrate was 540° C. The layer (304) had a carrier concentration of $2.0\times10^{16}$ cm$^{-3}$ and a thickness of 160 nm. A p type layer (305) was formed on the layer (304). The layer (305) was formed with a condition that a source temperature was 630° C., that of zinc oxide was 610° C. and that of a substrate was 530° C. It had a carrier concentration of $7.0\times10^{16}$ cm$^{-3}$ and a thickness of 80 nm. A n type molybdenum oxide layer (306) was formed on the layer (305) except its peripheral region. The layer (306) was formed with a condition that a source temperature was 700° C. and that of a substrate was 630° C. The layer (306) had a carrier concentration of $3.0\times10^{17}$ cm$^{-3}$ and a thickness of 60 nm. A cathode electrode (311) was formed on the layer (306). A gate electrode (312) was formed on the peripheral exposed region of the layer (305). An anode electrode (313) was formed on the back surface of the silicon substrate. The cathode electrode (311) was constituted of aluminum/titanium double layers. The gate electrode (312) was constituted of nickel/titanium/gold triple layers and the anode electrode was constituted of gold.

Simulation for the thyristor whose structure is shown in FIG. 5 assuming that molybdenum oxide has a bandgap of 3.75 eV showed that the repetitive OFF-state voltage was 5200V, the controllable ON-state current was 5000 A. It is known in the art that a thyristor with almost the same structure formed of SiC has a repetitive OFF-state voltage of 4500V and a controllable ON-state current of 4000 A. Therefore a thyristor comprising of molybdenum oxide has superior characteristics to those comprising of SiC. There has been no report on a thyristor comprising of GaN.

Figure 6:
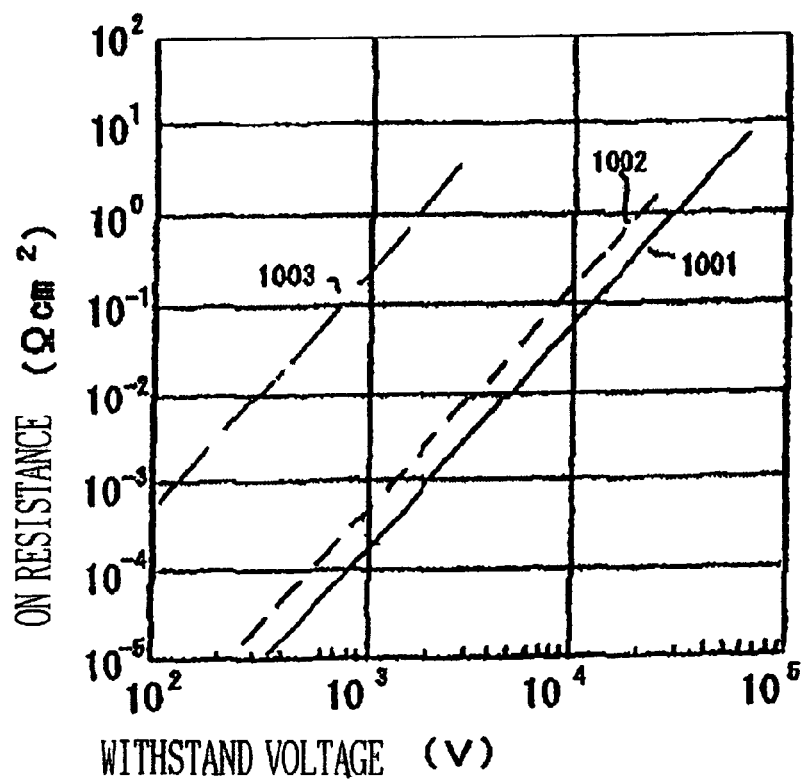
FIG. 6 shows the relation between a withstand voltage and an on-resistance obtained by simulation for the thyristor whose structure is shown in FIG. 5.

FIG. 6 shows the relation between a withstand voltage and an ON-state resistance obtained by simulation for the thyristor shown in FIG. 5. The line (1001) shows the relation for the thyristor formed of molybdenum oxide with a bandgap of 3.75 eV, the line (1002) shows that for SiC device and the line (1003) shows that for Si device. The results shown in FIG. 6 mean that a thyristor with much superior characteristics relative to those of thyristor formed of Si or SiC can be obtained using molybdenum oxide. That is, a thyristor with much superior characteristics than those of known thyristors without using an expensive substrate and fabrication process at a high temperature.

While a structure in which npnp-type conductive layers are included from the top layer on which the cathode electrode is formed to the bottom in illustrated in FIG. 5, a structure in which pnpn-type conductive layers are included from the top to the bottom is also allowable.

It is apparent that a diode which includes one pn junction can be formed if a bipolar transistor which includes two pn junctions can be achieved. Therefore, a pn junction diode is also included in the scope of the present invention.

Here to fore the details of the present invention have been described with reference of some embodiments including transistors and a thyristor. However the spirit of the present invention is not restricted to those devices. The advantageous points of the present invention come from that high purity molybdenum oxide has a large bandgap and can be formed at a relatively low temperature lower than 700° C., in many cases lower than 650° C.

Details of the present invention have been described with reference to the embodiments of a transistor and a thyristor. Merits obtained from the fact that high-purity molybdenum oxide has a large bandgap are useful in other electronic devices based on the principle of the present invention. In addition, the fact that molybdenum oxide can be formed on substrates which consist of materials which are used in known semiconductor electronic devices makes them more useful in other electronic devices. Such applications of the present invention are easily derived in the art and they are included in the scope of the present invention.

What is claimed is:

1. A semiconductor electronic device which has a layer of crystalline molybdenum oxide formed directly by deposition on a substrate which comprises material selected from IV element semiconductors, III-V compound semiconductors, IV compound semiconductors, organic semiconductors and their derivatives or glasses.

2. The semiconductor electronic device according to claim 1,
wherein said electronic device is a resistor device, a diode, a transistor, a Hall effect device, a varactor, a thermistor, a thyristor or a memory device.

3. The semiconductor electronic device according to claim 1,
wherein said molybdenum oxide is a high-purity molybdenum oxide which has a bandgap equal to or greater than 3.45 eV.

4. The semiconductor electronic device according to claim 1,
wherein said molybdenum oxide is a high-purity molybdenum oxide which is formed by vapor phase deposition.

5. The semiconductor electronic device according to claim 1,
wherein said substrate, on which the layer of molybdenum oxide is formed, is a silicon substrate.

6. The semiconductor electronic device according to claim 1,
wherein said electronic device is a thyristor having a device structure consisting of a first p type molybdenum oxide layer formed directly on a substrate by deposition, a first n type molybdenum oxide layer, a second p type molybdenum oxide layer and a second n type molybdenum oxide layer piled-up in this sequence on said substrate.

7. The semiconductor electronic device according to claim 1,
wherein said electronic device is a thyristor having a device structure consisting of a buffer layer of molybdenum oxide formed directly on a substrate by deposition, a first p type molybdenum oxide layer, a first n type molybdenum oxide layer, a second p type molybdenum oxide layer and a second n type molybdenum oxide layer piled-up in this sequence on said substrate.

8. The semiconductor electronic device according to claim 1,
wherein said electronic device is a thyristor having a device structure consisting of a first n type molybdenum oxide layer formed directly on a substrate by deposition, a first p type molybdenum oxide layer, a second n type molybdenum oxide layer and a second p type molybdenum oxide layer piled-up in this sequence on said substrate.

9. The semiconductor electronic device according to claim 1,
wherein said electronic device is a thyristor having a device structure consisting of a buffer layer of molybdenum oxide, a first n type molybdenum oxide layer formed directly on a substrate by deposition, a first p type molybdenum oxide layer, a second n type molybdenum oxide layer and a second p type molybdenum oxide layer piled-up in this sequence on said substrate.

10. The semiconductor electronic device according to any of claims 6-9,
wherein said substrate comprises silicon.

11. The semiconductor electronic device according to claim 1,
wherein said electronic device is a field effect transistor in which said molybdenum oxide layer formed directly on a substrate by deposition is used at least as a channel layer of said field effect transistor.

12. The semiconductor electronic device according to claim 1,
wherein said electronic device is a field effect transistor in which said molybdenum oxide layer is formed on a silicon substrate.

13. The semiconductor electronic device according to claim 1,
wherein said electronic device is a field effect transistor in which at least one buffer layer of molybdenum oxide formed directly on a substrate by deposition is interposed between said channel layer and said substrate.

14. The semiconductor electronic device according to claim 1,
wherein said electronic device is a bipolar transistor in which said molybdenum oxide layer formed directly on a substrate by deposition is used in at least one of an emitter region, a base region and a collector region in said bipolar transistor.

15. The semiconductor electronic device according to claim 1,
wherein said electronic device is a bipolar transistor in which said molybdenum oxide layer is formed on a silicon substrate.

16. The semiconductor electronic device according to claim 1,
wherein said electronic device is a bipolar transistor in which at least one buffer layer of molybdenum oxide formed directly on a substrate by deposition is interposed between said collector and said substrate or between said emitter and said substrate.

* * * * *